(12) United States Patent
McDonald et al.

(10) Patent No.: US 7,014,888 B2
(45) Date of Patent: Mar. 21, 2006

(54) METHOD AND STRUCTURE FOR FABRICATING SENSORS WITH A SACRIFICIAL GEL DOME

(75) Inventors: William G. McDonald, Scottsdale, AZ (US); Stephen Ryan Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 103 days.

(21) Appl. No.: 10/326,675

(22) Filed: Dec. 23, 2002

(65) Prior Publication Data

US 2004/0118214 A1   Jun. 24, 2004

(51) Int. Cl.
 *B05D 1/32* (2006.01)
 *B05D 3/06* (2006.01)
 *B05D 7/20* (2006.01)

(52) U.S. Cl. ............... 427/558; 427/154; 427/259; 427/264; 427/273; 427/282

(58) Field of Classification Search ........ 427/154–156, 427/259, 264, 265, 273, 282, 336, 557, 558, 427/387; 73/756; 361/517–520, 534–539
See application file for complete search history.

(56) References Cited

U.S. PATENT DOCUMENTS

| 4,059,708 A | * | 11/1977 | Heiss et al. ............... 427/96.2 |
| 5,164,558 A | * | 11/1992 | Huff et al. ................. 200/83 R |
| 6,335,224 B1 | * | 1/2002 | Peterson et al. ............. 438/114 |
| 6,401,545 B1 | * | 6/2002 | Monk et al. ................. 73/756 |
| 2002/0095980 A1 | * | 7/2002 | Breed et al. ................. 73/146 |

* cited by examiner

*Primary Examiner*—Fred J. Parker

(57) ABSTRACT

A method and structure that protects interior electrical components of a pressure sensor (4) from corrosive particles using a sacrificial gel dome (30) to form a vent (34) in a protective gel (32) that covers electrical components that can be corroded such as wires (16), bond pads (18), and electrical leads (14). Sacrificial gel dome (30) is dispensed over a diaphragm (28) of pressure sensor (4) to form vent (34) enabling diaphragm (28) to sense pressure variations without the influence of protective gel (32). Sacrificial gel dome (30) is removed through a water rinsing process (42) to expose vent (34).

17 Claims, 5 Drawing Sheets

METHOD AND STRUCTURE FOR FABRICATING SENSORS WITH A SACRIFICIAL GEL DOME

FIELD OF THE INVENTION

The present invention relates to the field of structures used to protect sensor devices from environmental conditions.

BACKGROUND OF THE INVENTION

Sensors provide a wealth of information to the people and equipment that utilize their readings. A common use of sensors is for automotive applications. In an automobile, sensors provide information on the speed of the car, condition of the engine, amount of fuel available, and even outside environmental conditions.

During the operation of an automobile, it is highly desirable to ensure that the tires are properly inflated. The safety of the vehicle occupants and the vehicle depends on having the tires properly inflated. In the event that the tires are not properly inflated, severe damage can occur to the tires. This damage to the tires can result in great harm, even death to the vehicle occupants. For instance, the various layers forming the tire can separate causing the tire to fail structurally. Alternatively, an over-inflated tire that encounters a road obstacle such as a rock can burst. It therefore becomes highly desirable to monitor the pressure of the tires to ensure that they are properly inflated.

More specifically, during normal operation at a constant temperature, tires can lose air pressure at the rate of one psi per month. Additionally, tires can lose air pressure at the rate of one psi for every 10 degrees Fahrenheit temperature drop. Tires that are under inflated are less able to support weight than properly inflated tires. An exemplary weight for a sport utility vehicle is 6540 pounds. An exemplary set of tires, properly inflated at 30 psi, can support 6540 pounds, thereby safely carrying the SUV. However, these tires only have a carrying capacity of 5610 pounds if they are inflated to 20 psi. Consequently, when under inflated at 20 psi, the tires are overloaded by 1230 pounds. This under inflation and overloading of the tires can lead to serious, if not deadly consequences on the highway.

Further, a lower than desired air pressure within the tire during operation increases the heat within the tire walls during operation. This heat increases as the speed of the vehicle increases. At high speeds on a highway, the heat can reach such a level within under inflated tires that the various layers forming the tire separate from each other. This separation can lead to a car accident injuring the occupants of the vehicle and potentially the occupants of other vehicles as well. As a matter of safety, to protect the lives of the vehicle occupants, it becomes highly desirable to place pressure sensors in each tire to monitor the air pressure and display the real time pressure readings on the dashboard for the vehicle driver. Through providing the driver with real time air pressure information, the driver can properly maintain the air pressure of the tires and safely operate the vehicle.

Aside from safety, the air pressure of the tires also affects the vehicle fuel efficiency. Properly inflated tires lead to greater fuel efficiency than when tires are under-inflated. Therefore, in addition to safety, fuel efficiency is another reason that it is highly desirable to monitor the pressure of the tires.

Placing a pressure sensor in a tire to monitor the air pressure presents several technical challenges. The environment within the tire is highly corrosive to solid state pressure sensors. As protection to this corrosive environment, internal tire pressure sensors are provided with various coatings, encapsulant, or diaphragms made from various elastic gels, polymers, or other materials.

As a component that is placed in each and every tire, it is highly desirable to minimize the cost of the tire pressure sensor. Through simplifying the design, manufacture, and components of the tire pressure sensor, it is possible to reduce the sensor cost.

In addition to automotive uses, sensors provide valuable information for commercial and industrial applications. These applications include, but are not limited to medical uses, biological and chemical monitors for research and manufacturing, as well as any fluid or gaseous environmental monitors.

DETAILED DESCRIPTION OF A PREFERRED EMBODIMENT

Figure 1:
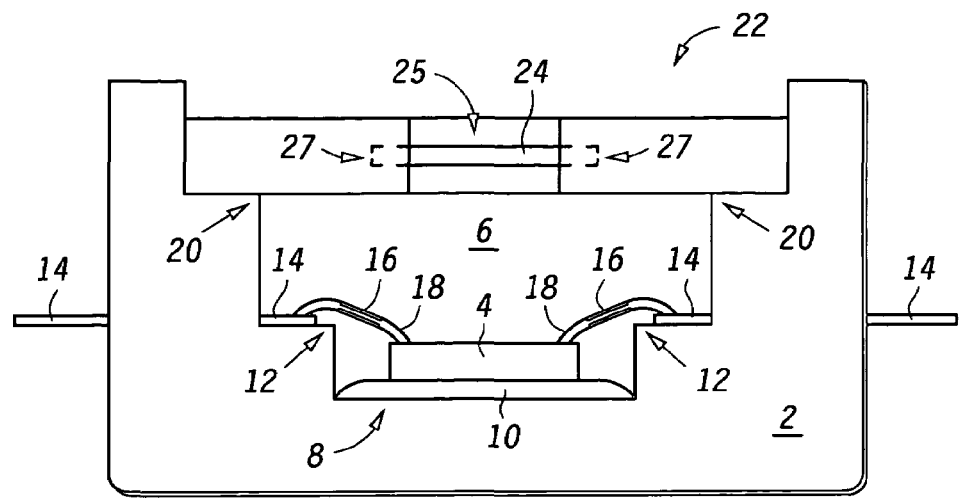
FIG. 1 illustrates a side view of a sensor package.

Referring to the Figures by characters of reference, FIG. 1 illustrates a side view of a pressure sensor package. The pressure sensor package includes a durable housing 2 that protects a pressure sensor 4 from a corrosive environment that may exist outside of housing 2. Pressure sensor packages are used in a wide variety of applications. It is commonly desirable to measure a pressure within a corrosive environment. Corrosive environments may exist when measuring the pressure for chemical, biological, or medical applications. In addition, a corrosive environment exists when measuring the pressure within a vehicle tire.

For safety reasons, it is desirable to measure the pressure within vehicle tires. Maintaining proper tire pressure is one means of avoiding accidents and keeping the vehicle in a safe operating condition. The environment within the tire is potentially corrosive to the metal and semiconductor components of pressure sensor 4. For instance, the interior of the tire may have tire mounting paste, tire mounting and general purpose lubricants, tire de-mounting fluid, break fluid, degreaser, wheel cleaner, mineral oil, moisture, and other contaminants. These contaminants could damage the operation of pressure sensor 4. Pressure sensor 4 includes metal and semiconductor components that will become damaged when placed in the corrosive environment. Placing pressure sensor 4 within an interior chamber 6 of durable housing 2 is one step toward protecting pressure sensor 4 from the corrosive environment.

Pressure sensor 4 is mounted to a bottom recess 8 of durable housing 2 with an adhesive material 10. Adjacent to pressure sensor 4 are a pair of shelves 12 that support a plurality of electrical leads 14. Electrical leads extend from interior chamber 6, through durable housing 2, into the environment exterior to durable housing 2. Electrical leads provide pressure sensor 4 with the ability to communicate with circuitry external to durable housing 2. Electrical leads 14 are given mechanical support by shelves 12. Wires 16 electrically couple electrical leads 14 to pressure sensor 4. Wires 16 are thermosonically bonded to electrical leads 14 and bond pads 18 on the die of sensor 4.

Durable housing 2 is made from a material that is resistant to the exterior corrosive environment so that it can provide a corrosive barrier to protect pressure sensor 4. Note that wires 16, bond pads 18, and electrical leads 14 within interior chamber 6 are also vulnerable to corrosion from corrosive particulates that exist in the exterior environment. Durable housing 2 functions to shield wires 16, bond pads 18, and electrical leads 14 from these corrosive particulates as well.

Durable housing is also provided with a cap surface 20 mechanically supports a cap 22, illustrated in FIG. 1, that fits within interior chamber 6. Cap 22 can be provided with a porous membrane 24 is permeable to pressure for certain desired applications like measuring tire pressure. However, in other applications, it is possible to use sensor 4 without membrane 24 in cap 22. Note that where membrane 24 is used, it is not sufficiently porous to allow corrosive particulates that exist in the exterior environment from permeating through membrane 24 and into interior chamber 6. Together, cap 22, membrane 24, and durable housing 4 function to allow pressure sensor 4 to measure the outside pressure without exposure to the corrosive exterior environment. In automotive tire air pressure applications, it is possible to mount the packaged pressure sensor onto the wheel, wheel-rim, tire-valve, or tire.

It is possible to use a variety of materials to form membrane 8. For instance, either polyester, nylon, or a PolyTetraFluoroEthylene (PTFE) can form membrane 8. Membrane 8 is porous to filer out the corrosive elements in the tire environment while allowing the transmission of pressure. It is possible to treat polyester and nylon with one or more chemicals to make them hydrophobic and/or oleophobic. Further, it is possible to form PTFE with holes that are smaller than one micrometer in diameter such that it can filter out corrosive contaminants while still transmitting pressure.

While membrane 24 is impermeable to exterior corrosive particulates, it is possible for corrosive particulates to enter interior chamber 6 through other paths. First, there is a joint between cap 22 and durable housing 2 along cap surface 20. Second, there is the joint where membrane 24 attaches to cap 22. If any gaps exist at either of these two joints, corrosive particulates can penetrate into interior chamber 6 and corrode wires 16, bond pads 18, and electrical leads 14. It is therefore desirable to provide a structure that can protect wires 16, bond pads 18, and electrical leads 14 from corrosive particulates within interior chamber 6.

Note that membrane 24 is positioned in an opening 25 of cap 22. Sides 27 of membrane 24 are formed within cap 22, thereby holding membrane 22 in position under the action of pressure external to cap 22 and durable housing 2. Together, cap 22, membrane 24, and durable housing 2 form a protective barrier to environmental contaminants.

Figure 2:
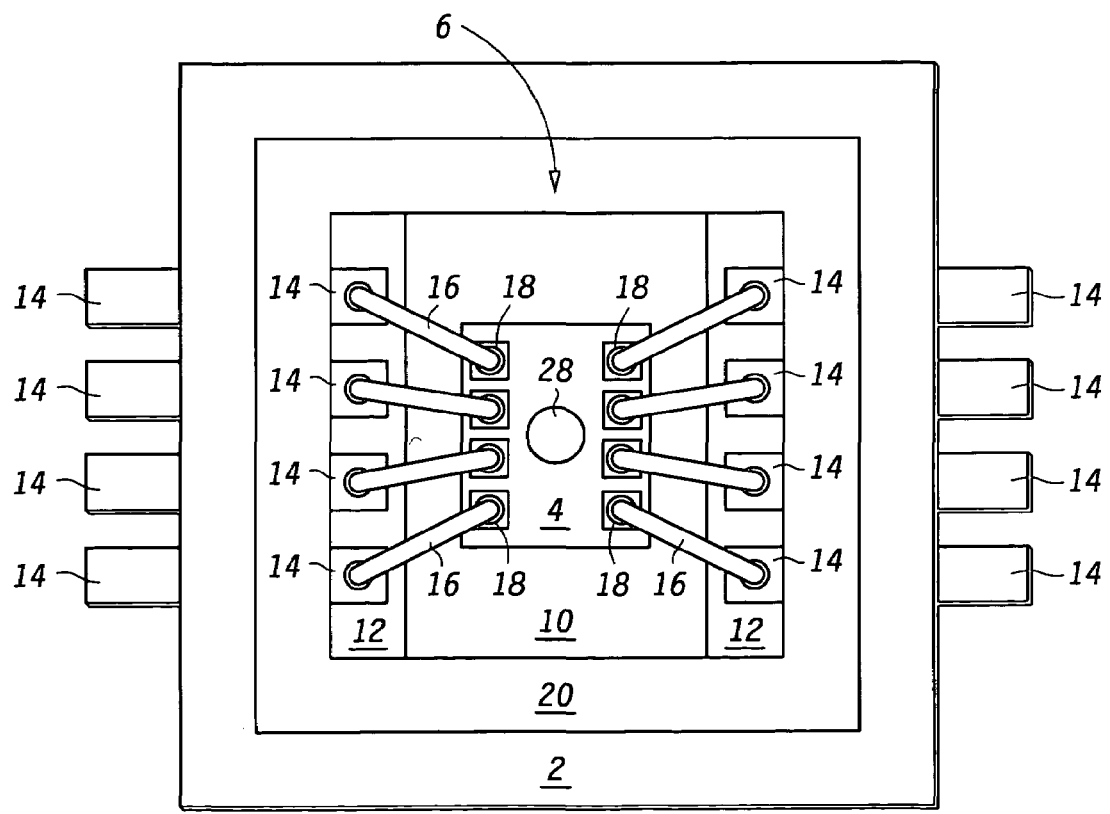
FIG. 2 illustrates a top view of a sensor package.

FIG. 2 illustrates a top view of a sensor package. In FIG. 2, cap 22 is removed to reveal the interior components of durable housing 2. Visible are cap surface 20 that mechanically supports cap 22. Shelves 12 provide structural support to electrical leads 14. Wires 16 couple pressure sensor 4 to electrical leads 14 with bond pads 18. Pressure sensor 4 resides in a bottom recess 8 of durable housing 2. Note that pressure sensor 4 includes a chip 26 that supports a diaphragm 28 that senses the pressure. Diaphragm 28 includes pressure transducers that sense pressure variations and converts them to electrical signals.

The electrical signals produced by diaphragm 28 under the action of pressure variations are passed through durable housing 2 by electrical leads 14 to an outside circuit. For instance, as an example, in a tire pressure sensor application, electrical leads 14 may be connected to an external wireless circuit. This external wireless circuit would transmit the sensed tire pressure variations to a receivers coupled to the vehicles central computer. This computer would then display the tire pressure information in some manner on the dashboard of the vehicle to inform the vehicle's driver of the state of the tire pressure. In this manner, the operator of the vehicle can better maintain the condition of the vehicle and make it more safe.

Figure 3:
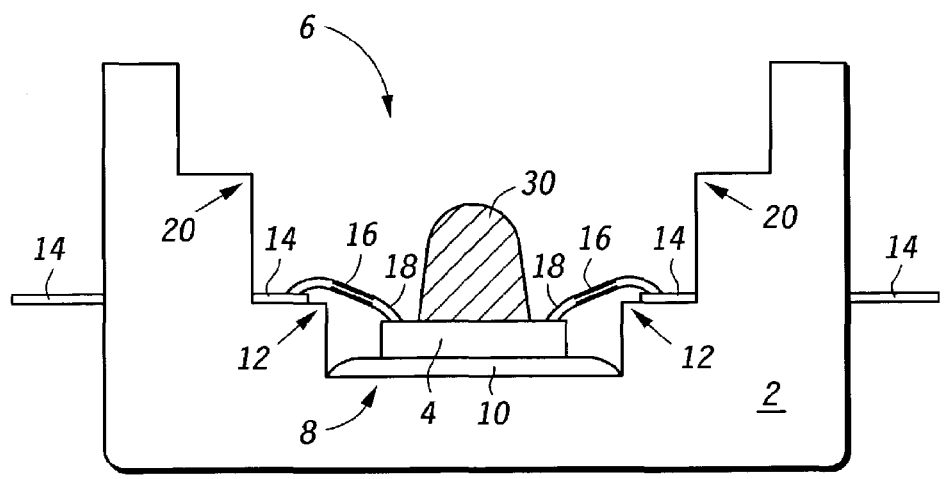
FIG. 3 illustrates a side view of a sacrificial gel dome formed over a sensor package in accordance with a preferred embodiment of the present invention.

FIG. 3 illustrates a side view of a sacrificial gel dome 30 formed over the sensor package in accordance with a preferred embodiment of the present invention. Note that in FIG. 3, cap 22 has not yet been mated to durable housing 2. After pressure sensor 4, electrical leads 14, wires 16, and bond pads 18 have all been secured to durable housing 2, the manufacturing process proceeds toward providing an environmental barrier for the electrical components within interior chamber 6. This manufacturing process begins with placing sacrificial gel dome 30 over pressure sensor 4. More specially, sacrificial gel dome 30 is place directly over diaphragm 28. Sacrificial gel dome 30 is made from a soluble material. In a later process, sacrificial gel dome 30 is removed with a fluid.

Figure 4:
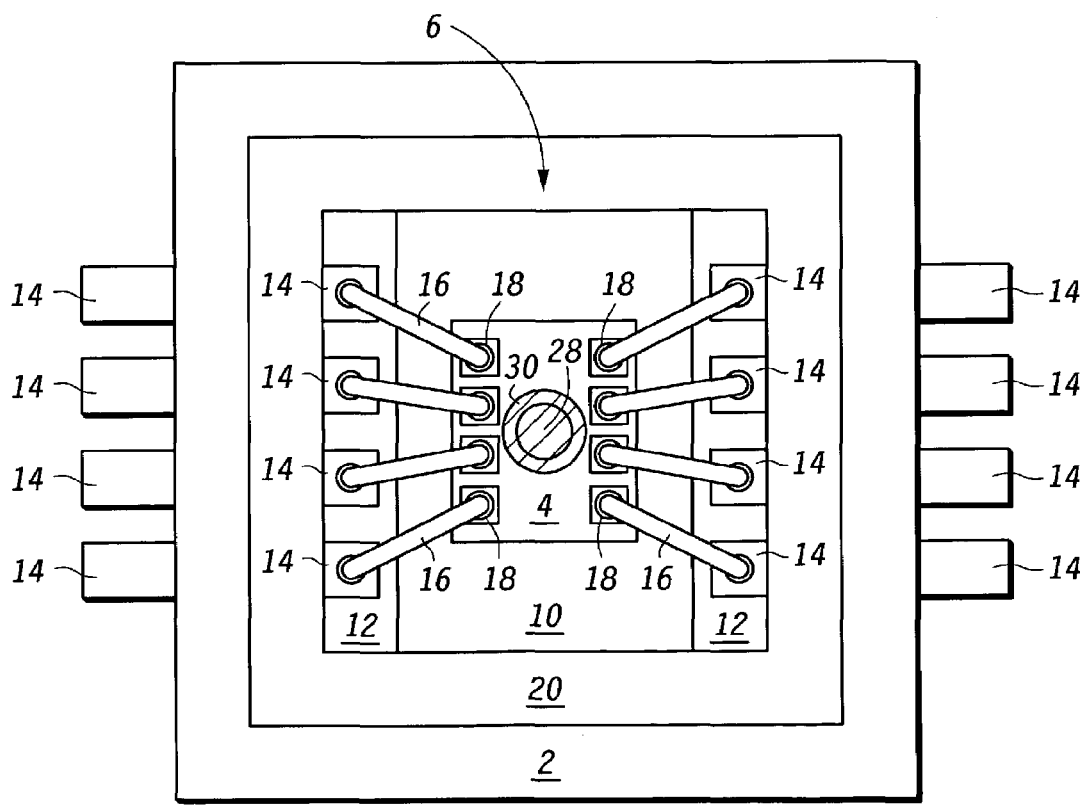
FIG. 4 illustrates a top view of a sacrificial gel dome formed over a sensor package in accordance with a preferred embodiment of the present invention.

FIG. 4 illustrates a top view of sacrificial gel dome 30 formed over the sensor package in accordance with a preferred embodiment of the present invention. Sacrificial dome 30 forms a mask over diaphragm 28. Sacrificial gel dome 30 provides a protective barrier over diaphragm 28. Note that sacrificial gel dome 30 only covers diaphragm 28 and not any of bond pads 18, wires 16, or electrical leads 14. Sacrificial gel dome 30 is a high viscosity material that is dispensed over diaphragm 28 and cured.

A preferred material for sacrificial gel dome 30 is DYMAX 9-20311-F Ultra-Violet/Visible water-soluble mask. This water soluble mask is dispensed in a high viscosity liquid form. This high viscosity enables sacrificial gel dome to remain at the location where it is dispensed. It is therefore possible to dispense this material directly over diaphragm 28 and have it remain over diaphragm 28 without the use of any other mask, dam, or structure to contain the material for sacrificial gel dome 30 over diaphragm 28. This DYMAX material is cured in several seconds under long wave UV light. In addition, this material does not require a long drying time or heat curing making it cost effective for fabrication. The DYMAX material is water soluble and leaves little or no solid residue. The fact that this DYMAX material leaves little or no solid residue is desirable due to the fact that remaining debris from sacrificial gel dome 30 that is left on diaphragm 28 after the dissolving process can alter the accuracy and precision of pressure readings made by diaphragm 28. While this DYMAX material is preferred, it is possible to make sacrificial gel dome 30 out of other materials that have a high viscosity, are water soluble, and easily curable.

Figure 5:
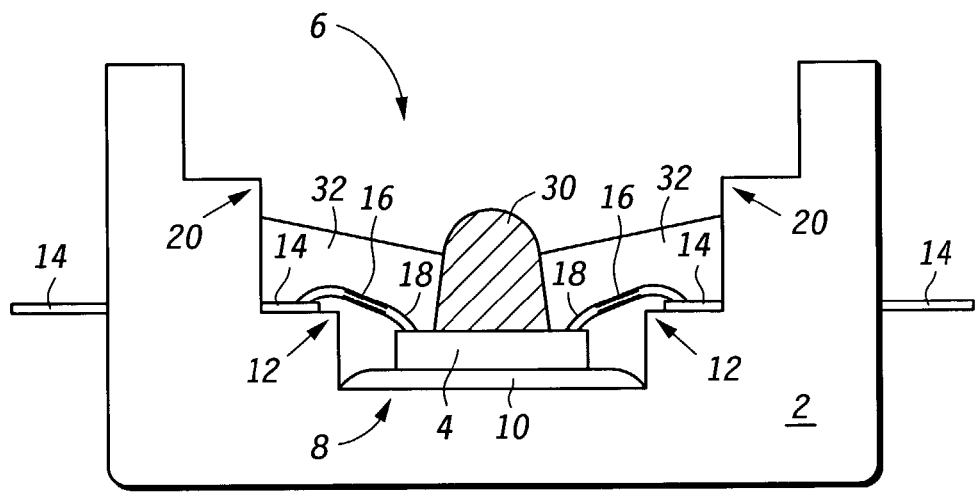
FIG. 5 illustrates a side view of a sensor package having a protective gel deposited over the sensor package around a sacrificial gel dome in accordance with a preferred embodiment of the present invention.

FIG. 5 illustrates a side view of the sensor package having a protective gel 32 deposited over the sensor package around sacrificial gel dome 30 in accordance with a preferred embodiment of the present invention. Protective gel 32 is dispensed within interior chamber 6 of durable housing 2. Protective gel 32 is dispensed to a depth such that it covers electrical leads 14, bond pads 18, and wires 16. The function of protective gel 32 is to form a protective barrier for electrical leads 14, bond pads 18, and wires 16 against any corrosive particulates that may penetrate durable housing 2, cap 22, or membrane 24 and reach interior chamber 6. In the event that corrosive particulates do penetrate into interior chamber 6, protective gel 32 inhibits the corrosive particulates from coming into contact with electrical leads 14, bond pads 18, and wires 16, thereby deterring corrosion from occurring.

In a preferred embodiment, gel 32 is a silicon based gel. Other types of protective gels are useable. Note that protective gel 32 is dispensed to a depth that leaves the top of sacrificial gel dome 30 uncovered. The top of sacrificial gel dome 30 is left uncovered so that it is possible to later dissolve sacrificial dome 30 in a subsequent process. Protective gel 32 has a low modulus. However, protective gel 32 remains in position over electrical leads 14, bond pads 18, and wires 16 and away from diaphragm 28 when deposited on sensor 4.

Figure 6:
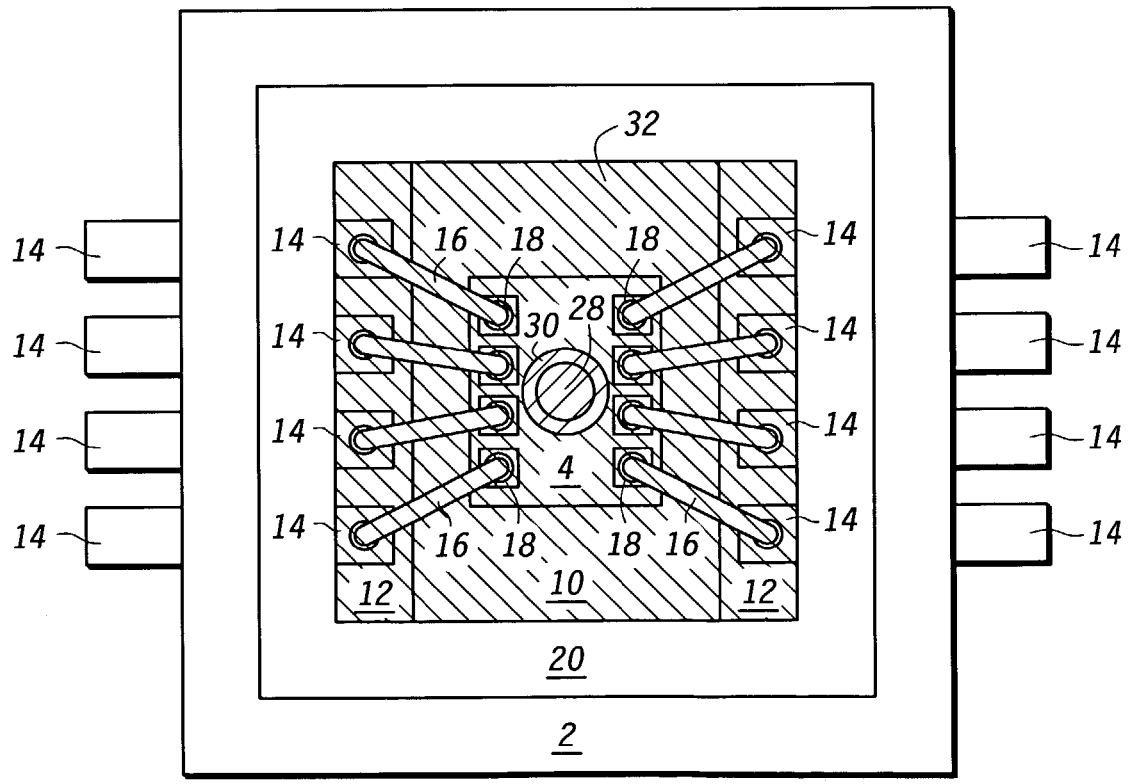
FIG. 6 illustrates a top view of a sensor package having a protective gel deposited over the sensor package around a sacrificial gel dome in accordance with a preferred embodiment of the present invention.

FIG. 6 illustrates a top view of a sensor package having a protective gel deposited over the sensor package around a sacrificial gel dome in accordance with a preferred embodiment of the present invention. Sacrificial gel dome 30 is positioned over diaphragm 28. Protective gel 32 is dispensed over electrical leads 14, bond pads 18, and wires 16 to protect them from corrosive particulates. Protective gel 32 is dispensed to a level such that it covers electrical leads 14, bond pads 18, and wires 16 without covering the top portion of sacrificial gel dome 30. Sacrificial gel dome 30 keeps protective gel 32 from covering diaphragm 28. Note that sacrificial gel dome 30 only covers diaphragm 28 and does not cover bond pads 18 or wires 16.

Figure 7:
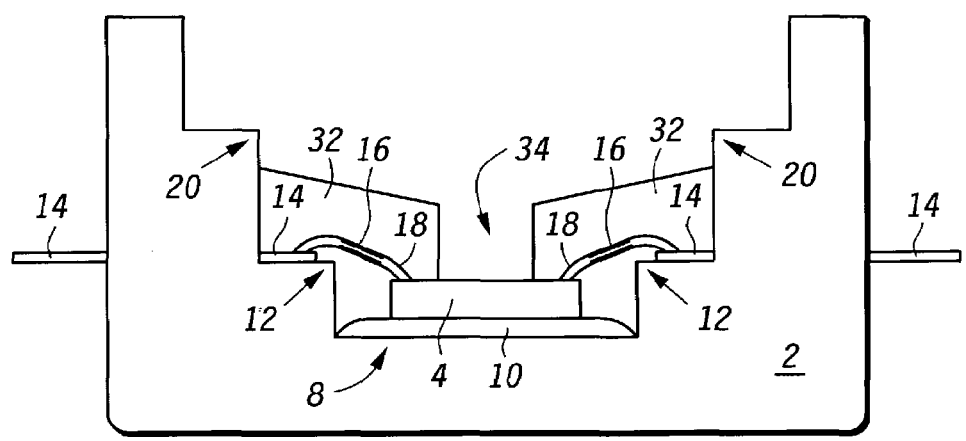
FIG. 7 illustrates a side view of a sensor package having a protective gel cover after the removal of a sacrificial gel dome.

FIG. 7 illustrates a side view of the sensor package having protective gel 32 after the removal of sacrificial gel dome 30. After deposition of protective gel 32, a hot DeIonized (DI) water rise is used to dissolve sacrificial gel dome 30. Through having deposited protective gel 32 to a level below the top of sacrificial gel dome 30, it is possible to dissolve sacrificial gel dome 30 with a hot DI water rinse. If protective gel 32 were dispensed to a level above sacrificial gel dome 30, the hot DI water rinse would not come into contact with sacrificial gel dome 32 and could consequently not dissolve it.

Dissolving sacrificial gel dome 30 with a hot DI water rinse opens a vent 34 to diaphragm 28. Vent 34 permits the communication of pressure through membrane 24 down to diaphragm 28 without interference of protective gel 32. Vent 34 covers the entire area of diaphragm 28 so that it can operate unhindered from protective gel 32. Note that after the hot DI water rinse, protective gel 32 remains in position over electrical leads 14, bond pads 18, and wires 16, thereby continuing to protect these elements from corrosion.

It is possible for diaphragm 28 to function and sense pressure if it were partially or entirely covered with protective gel 32. However, covering diaphragm 28 with protective gel 28 has disadvantages. One application of the pressure sensor package that includes pressure sensor 4 and durable housing 2 illustrated in FIG. 7 is to monitor the air pressure within a vehicle tire. In order to sense the air pressure within the tire, the pressure sensor package is placed within the vehicle tire. During normal operation of the tire, the tire will rotate at high speeds. This tire rotation places a centrifugal force on pressure sensor 4 and protective gel 32. When protective gel 32 covers diaphragm 28, the centrifugal force on protective gel 32 can push down on diaphragm 28 indicating that there is a greater amount of pressure within the tire than is actually present. In addition, the centrifugal force caused by the tire can pull gel 32 away from diaphragm 28 causing another pressure reading that deviates from the actual value.

Sacrificial gel dome 30 resolves the centrifugal force problem caused when protective gel 32 is displaced over diaphragm 28 by forming vent 34. Vent 34 provides a void through which pressure can communicate unhindered by protective gel 32. Further, within the environment of a moving tire, there is no centrifugal force placed on diaphragm 28 by protective gel 32 as a consequence of the formation of vent 34. As a result, vent 34 enables diaphragm 38 to sense pressure more accurately and precisely. Consequently, through providing more accurate pressure readings, vent 34 and pressure sensor 4 are better able enhance the safety of a car vehicle by enabling correct tire pressure readings.

Figure 8:
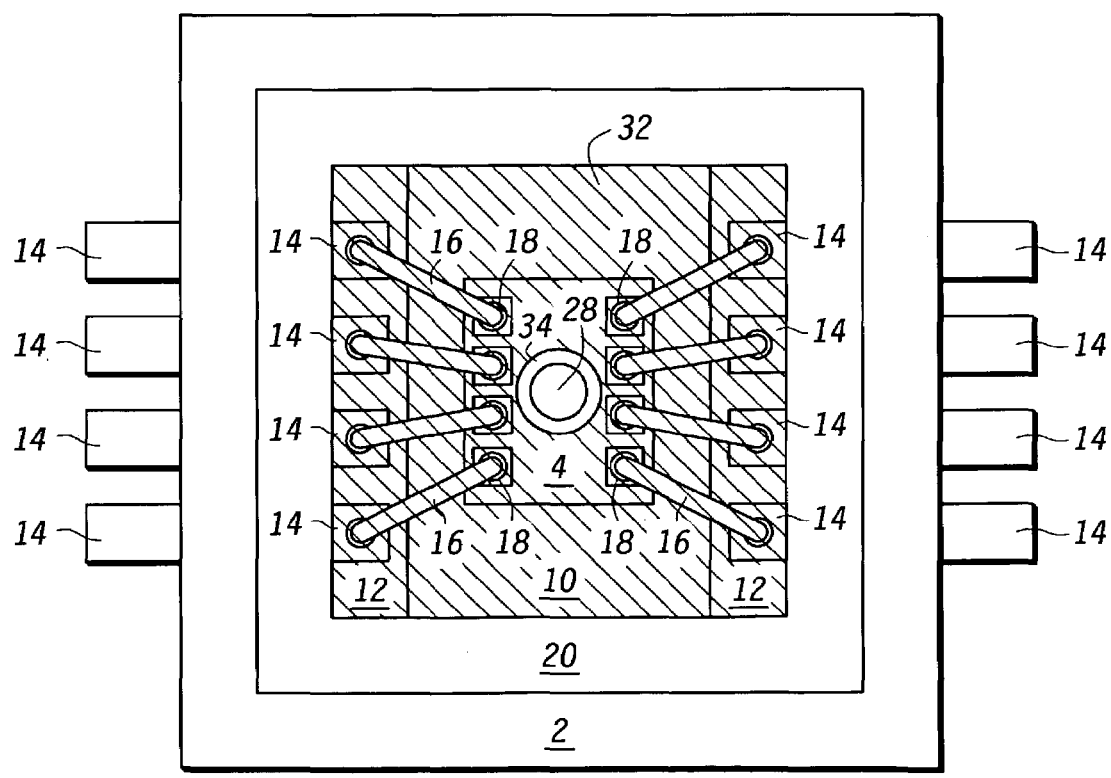
FIG. 8 illustrates a top view of a sensor package having a protective gel cover after the removal of a sacrificial gel dome.

FIG. 8 illustrates a top view of a sensor package having a protective gel cover after the removal of a sacrificial gel dome. In this Figure, protective gel 32 is illustrated as covering electrical leads 14, bond pads 18, and wires 16, thereby protecting them from corrosive particles that may leak through joints in housing 2 and cap 22. Vent 34 is centered over diaphragm 28. Note that vent 34 only covers diaphragm 28 and not any of electrical leads 14, bond pads 18, and wires 16. In this manner, vent 34 allows communication of pressure through membrane 24 into interior chamber 6 and to diaphragm 28. However, vent 34 does not expose the metal components of pressure sensor 4 to corrosion, such as electrical leads 14, bond pads 18, and wires 16. Together, vent 34 and protective gel 32 shield the sensitive components of pressure sensor 4 from corrosive elements while allowing unfettered pressure sensings by diaphragm 28.

The use of a water soluble sacrificial gel dome 30 is desirable due to its ease of manufacture and cost effectiveness. Note that sacrificial gel dome 30 is formed in the general shape of a rounded dome due to the fact that the material for sacrificial gel dome 30 is deposited in a highly viscous liquid state. This high viscosity enables the material for sacrificial gel dome 30 to remain where it is placed without the aid of additional structures or barriers. The dome shape of sacrificial gel dome 30 arises naturally from the viscous nature of the material for gel dome 30 and its nature of deposition and is merely exemplary.

Subsequent to the removal of sacrificial gel dome 30 through a hot DI water rinse, cap 22 having membrane 24 disposed therein is locked into place within interior chamber 6 of durable housing 2.

Figure 9:
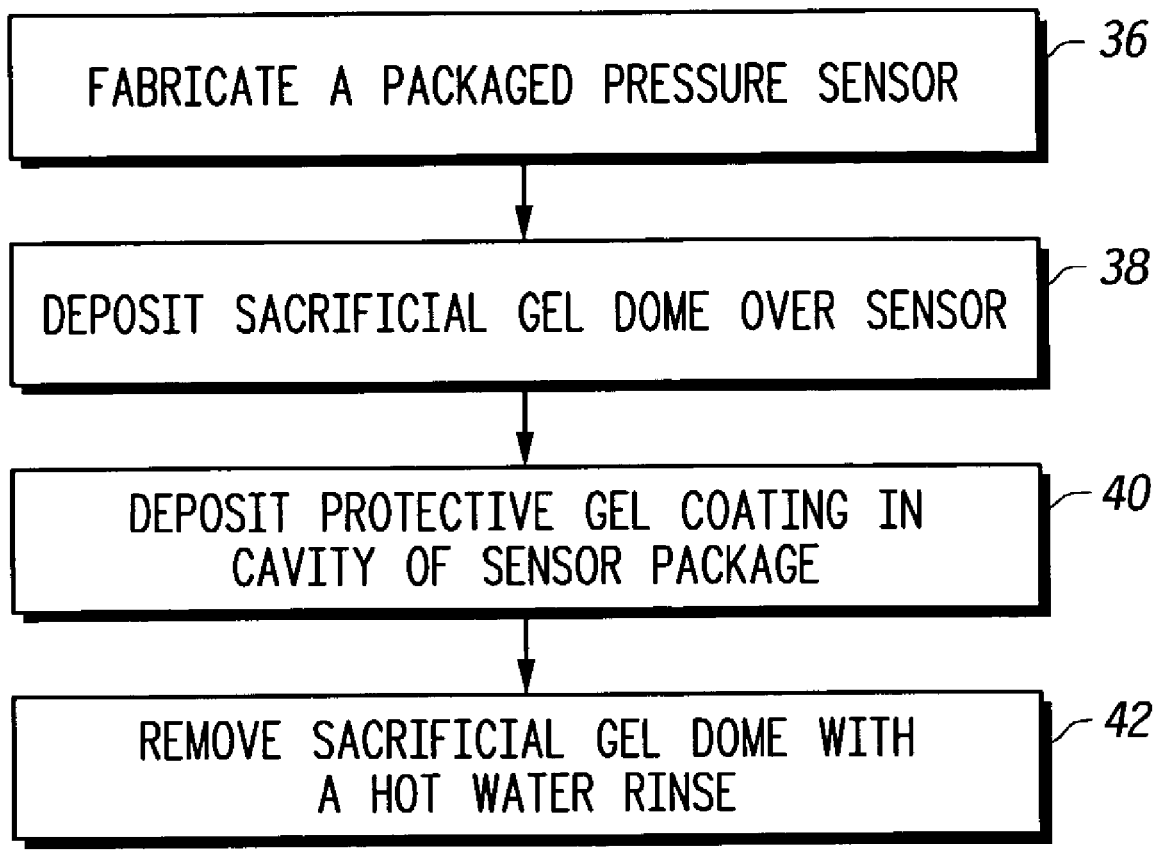
FIG. 9 illustrates a flow chart depicting the process of fabricating a preferred embodiment of the present invention.

FIG. 9 illustrates a flow chart depicting the process of fabricating a preferred embodiment of the present invention. In step 36, a packaged pressure sensor is fabricated having durable housing 2, pressure sensor 4, electrical leads 14, bond pads 18, and wires 16. In step 38, a drop of gel fluid is administered over diaphragm 28. This gel fluid has a high viscosity so it remains in position over diaphragm 28. This gel fluid is cured through either a temperature or UV curing process to form sacrificial gel dome 30. Preferably, a small amount of DYMAX 9-20311-F UV/Visible curing water soluble mask is dispensed on the surface of pressure sensor 4 using a needle in the form of a drop. This droplet of material is then hardened into sacrificial dome 30 under UV light for greater than 30 seconds.

Protective gel 32 is then dispensed into interior chamber 6 to cover electrical leads 14, bond pads 18, and wires 16 in step 40. However, protective gel is dispensed to a depth that is below sacrificial gel dome 30 so that sacrificial gel dome 30 can be dissolved in step 42. Further in step 40, protective gel 32 is cured with a conventional gel curing process. Preferably, protective gel 32 is cured through placing it in an oven at 150 degrees Celsius for one hour. Protective gel 32 has a modulus such that it remains in position over electrical leads 14, bond pads 18, and wires 16 and away from diaphragm 28, to prevent protective gel 32 from altering the accuracy of the pressure readings sensed by diaphragm 28.

Finally, in step 42, a hot DI water rinse is performed to remove sacrificial dome 30 off of diaphragm 28. Sacrificial gel dome 30 dissolves in this water rinse to such a degree that there are no significant pieces of it remaining over diaphragm 28.

Providing a sacrificial gel dome 30, protective gel 32, and vent 34 has the advantage of increasing the accuracy of pressure readings taken by diaphragm 28. Protective gel mass 32 that extends over diaphragm 28 of pressure sensor 4 can cause off set shifts in pressure readings due to physical changes of protective gel 32. These physical changes include, but are not limited to temperature fluctuations or acceleration effects of sensor 4 during operation. Through providing vent 24 over diaphragm 28 through the use of sacrificial gel dome 30, these physical effects are reduced or eliminated, thereby increasing the accuracy and precision of diaphragm 28 in making pressure readings.

At the completion of the process illustrated by FIG. 9, cap 22 having membrane 24 formed therein is attached to durable housing 2. At the completion of this attachment process, pressure sensor 4 has several layers of environmental protection shielding it from corrosive elements exterior to durable housing 2. The first layer of environmental protection is durable housing 2 and cap 22. Both durable housing 2 and cap 22 are made from a corrosive resistant material, such as a polymer. It is possible that corrosive particulates can penetrate this first layer of environmental protection through the joints that lie between cap 22 and housing 2 along cap surface 20, or the joint between membrane 24 and cap 22. In the event that corrosive particulates do manage to penetrate interior chamber 6 through one of these joints, protective gel 32 forms a second line of defense. Through covering electrical leads 14, bond pads 18, and wires 16, protective gel 32 forms a barrier to corrosive particulates. Together, durable housing 2, cap 22, membrane 28, and protective gel 32 function to protect electrical leads 14, bond pads 18, and wires 16 from corrosion by the outside environment.

The structure and process of creating vent 34 for diaphragm 28 is also highly advantageous due to its ease and simplicity of manufacture. The minimal manufacturing steps required to fabricate vent 34 makes the present preferred process cost effective.

Although the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

We claim:

1. A method of fabricating corrosion protection for a sensor, comprising:
    dispensing a viscous mask over a diaphragm of a pressure sensor contained within a housing;
    hardening said viscous mask after said dispensing;
    after said hardening said viscous mask, dispensing a protective gel into said housing over an electrical lead and a wire coupled to said pressure sensor, wherein said dispersing said protective gel includes dispersing said protective gel to leave a top of said viscous mask uncovered;
    hardening said protective gel; and
    removing said viscous mask, wherein said removing said viscous mask includes removing said viscous mask with a fluid.

2. The method of claim 1, wherein said hardening of said viscous mask is performed with an ultra-violet light.

3. The method of claim 1, wherein said hardening of said protective gel is performed with a thermal process.

4. The method of claim 1, wherein said removing of said viscous mask further comprises rinsing said viscous mask from said pressure sensor.

5. The method of claim 4, wherein the removing of said viscous mask further includes dissolving said viscous mask with hot deionized water.

6. The method of claim 1, wherein said dispensing a protective gel further comprising depositing said protective gel to a level below a top of said viscous mask.

7. The method of claim 1, further comprising aligning a needle over said diaphragm to dispense said viscous mask as a droplet.

8. The method of claim 1, wherein dispensing said viscous mask over said diaphragm is performed without the aid of a structure to contain said viscous mask over said diaphragm.

9. The method of claim 4 wherein said rinsing said viscous mask from said pressure sensor further includes dissolving said viscous mask wherein said dissolving said viscous mask leaves little or no solid residue of a material of said viscous mask.

10. The method of claim 1 wherein said removing said viscous mask forms a vent through said protective gel to said diaphragm.

11. The method of claim 1 wherein said viscous mask is of a material that is water soluble.

12. The method of claim 1 wherein said dispensing a protective gel into said housing further includes dispensing a protective gel into said housing over a bond pad.

13. The method of claim 1 wherein said removing said viscous mask is performed after said hardening said viscous mask.

14. The method of claim 1 wherein said removing said viscous mask is performed after said hardening said protective gel.

15. The method of claim 1 further comprising attaching a cap with a porous membrane to said housing.

16. A method of fabricating corrosion protection for a sensor, comprising:

dispensing a viscous mask over a diaphragm of a pressure sensor contained within a housing;
hardening said viscous mask after said dispensing said viscous mask;
after said hardening said viscous mask, dispensing a protective gel into said housing;
hardening said protective gel; and
after said hardening said viscous mask, removing said viscous mask with a fluid to form a vent through said protective gel to said diaphragm.

17. A method of fabricating corrosion protection for a sensor, comprising:

dispensing a viscous mask over a diaphragm of a pressure sensor contained within a housing;
hardening said viscous mask after said dispensing said viscous mask;
after said hardening said viscous mask, dispensing a protective gel into said housing to a level below a top of said viscous mask over an electrical lead and a wire coupled to said pressure sensor;
hardening said protective gel; and
removing said viscous mask with a fluid.

* * * * *